(12) United States Patent
Roh et al.

(10) Patent No.: US 8,923,043 B2
(45) Date of Patent: Dec. 30, 2014

(54) MEMORY DEVICE USING FLAG CELLS AND SYSTEM USING THE MEMORY DEVICE

(71) Applicant: Samsung Electronics Co., Ltd., Suwon-Si, Gyeonggi-Do (KR)

(72) Inventors: Yang-Woo Roh, Hwaseong-si (KR); Chul Lee, Hwaseong-si (KR); Sang-Hoan Chang, Suwon-si (KR); Jae-Soo Lee, Hwaseong-si (KR); Joo-Young Hwang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 140 days.

(21) Appl. No.: 13/762,737

(22) Filed: Feb. 8, 2013

(65) Prior Publication Data

US 2013/0208537 A1    Aug. 15, 2013

(30) Foreign Application Priority Data

Feb. 9, 2012    (KR) ................. 10-2012-0013381

(51) Int. Cl.
*G11C 11/00* (2006.01)
*G11C 7/00* (2006.01)
*G11C 13/00* (2006.01)
*G11C 7/14* (2006.01)

(52) U.S. Cl.
CPC ....... *G11C 13/0004* (2013.01); *G11C 13/0061* (2013.01); *G11C 2213/72* (2013.01); *G11C 7/14* (2013.01); *G11C 13/004* (2013.01); *G11C 2013/0078* (2013.01)
USPC ................... 365/163; 365/148; 365/200

(58) Field of Classification Search
USPC .......................................................... 365/163
See application file for complete search history.

(56) References Cited

U.S. PATENT DOCUMENTS

| 7,154,788 | B2 | 12/2006 | Takemura et al. |
| 7,224,599 | B2 | 5/2007 | Sakata et al. |
| 7,813,178 | B2 | 10/2010 | Nakai |
| 8,111,538 | B2 * | 2/2012 | Hosotani et al. ............. 365/148 |

FOREIGN PATENT DOCUMENTS

KR    20110024147 A    3/2011

* cited by examiner

*Primary Examiner* — Son Mai
(74) *Attorney, Agent, or Firm* — Harness, Dickey & Pierce, P.L.C.

(57) ABSTRACT

A memory device may include a normal cell which is configured to be programmed to a first resistance and stabilized as a resistance of the normal cell drifts from the first resistance to a second resistance; a flag cell which is configured to be programmed to a third resistance smaller than the first resistance and stabilized as a resistance of the flag cell drifts from the third resistance to a fourth resistance smaller than the second resistance; and a decision circuit which is configured to decide whether the flag cell has been stabilized in order to determine whether the normal cell has been stabilized.

19 Claims, 8 Drawing Sheets

MEMORY DEVICE USING FLAG CELLS AND SYSTEM USING THE MEMORY DEVICE

This application claims priority from Korean Patent Application No. 10-2012-0013381 filed on Feb. 9, 2012 in the Korean Intellectual Property Office, the disclosure of which is incorporated herein by reference in its entirety.

BACKGROUND

1. Field

Example embodiments of the inventive concepts relate to a memory device using flag cells and a system including the memory device.

2. Description of the Related Art

Examples of nonvolatile memories using resistance materials include phase-change random access memories (PRAMs) or phase-change memories (PCMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM or PCM may become a crystalline state or an amorphous state as it is cooled after being heated by a write current. The phase-change material has low resistance in the crystalline state and has high resistance in the amorphous state. Therefore, the crystalline state may be defined as set data or data 0, and the amorphous state may be defined as reset data or data 1.

In a PRAM, the resistance of a phase-change material may drift for a predetermined or reference period of time (referred to as a stabilization time) even after a predetermined or reference resistance (set data or reset data) is programmed into the phase-change material. That is, the resistance of the phase-change material may gradually increase during the stabilization time but may hardly change after the stabilization time. Therefore, if a programmed PRAM cell is read during the stabilization time, wrong data may be read, resulting in a read error.

SUMMARY

Aspects of example embodiments of the inventive concepts provide a memory device which can minimize a read error.

Aspects of example embodiments of the inventive concepts also provide a system which can minimize a read error.

However, aspects of example embodiments of the inventive concepts are not restricted to the one set forth herein. The above and other aspects of example embodiments of the inventive concepts will become more apparent to one of ordinary skill in the art to which example embodiments of the inventive concepts pertain by referencing the detailed description of example embodiments of the inventive concepts given below.

According to an aspect of example embodiments of the inventive concepts, a memory device may include a normal cell which is programmed to a first resistance and stabilized as a resistance thereof drifts from the first resistance to a second resistance; a flag cell which is programmed to a third resistance smaller than the first resistance and stabilized as a resistance thereof drifts from the third resistance to a fourth resistance smaller than the second resistance; and a decision circuit which decides whether the flag cell has been stabilized in order to determine whether the normal cell has been stabilized.

According to another aspect of example embodiments of the inventive concepts, a memory device may include a plurality of normal cells whose respective resistances are stabilized after drifting; at least one flag cell which corresponds to the normal cells and is stabilized later than the normal cells; and a decision circuit which decides whether the at least one flag cell has been stabilized in order to determine whether the normal cells have been stabilized, wherein data is programmed to the normal cells as the respective resistances of the normal cells change, and data is programmed to the at least one flag cell as the resistance of the at least one flag cell changes.

According to another aspect of example embodiments of the inventive concepts, a memory device may include a first memory cell; a flag memory cell; a write driver configured to store first data in the first memory cell by setting a resistance of the first memory cell, and configured to store second data in the flag memory cell by setting a resistance of the flag memory cell; a decision circuit configured to generate a decision signal based on the resistance of the flag memory cell and a reference resistance value, the decision signal indicating whether or not the resistance of the flag cell has stabilized; and a sense amplifier configured to read the first data from the first memory cell based on the determination signal.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A driving method using flag cells which will be described below is applicable not only to memory devices whose resistances change (or drift). The driving method is also applicable to all types of memory devices which are programmed to, e.g., a first set value and change from the first set value to a second set value over time.

Hereinafter, example embodiments of the inventive concepts will be described based on single-level cells (SLC). However, it is obvious to those of ordinary skill in the art to which example embodiments of the inventive concepts pertain that the following description is also applicable to multi-level cells (MLC).

Figure 1:
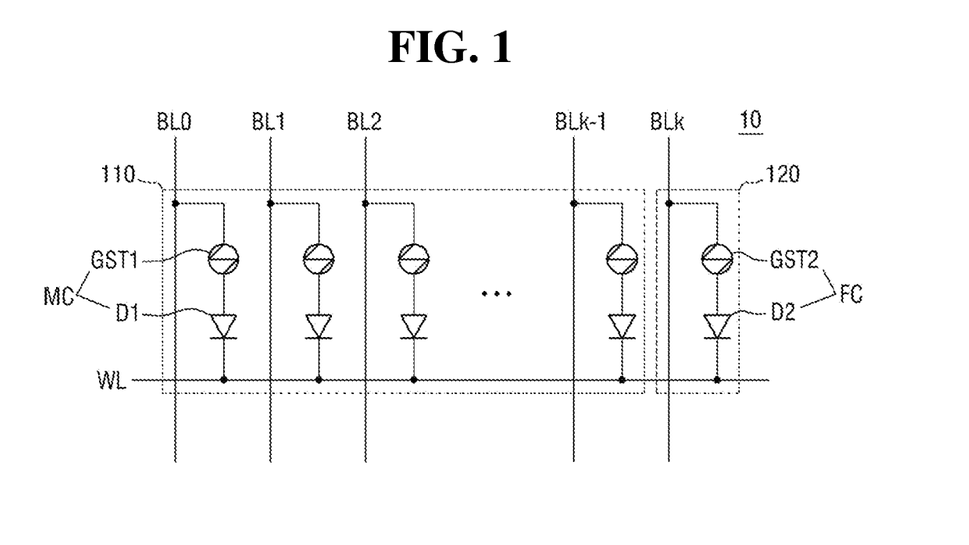
FIG. 1 is a circuit diagram of a memory device 10 according to some example embodiments of the inventive concepts.
Figure 2:
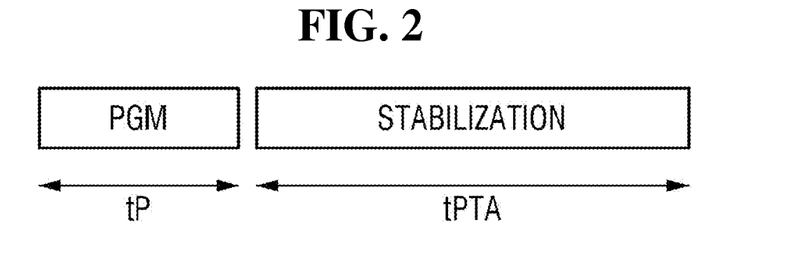
FIG. 2 is a diagram illustrating a program time tP and a stabilization time tPTA.
Figure 3:
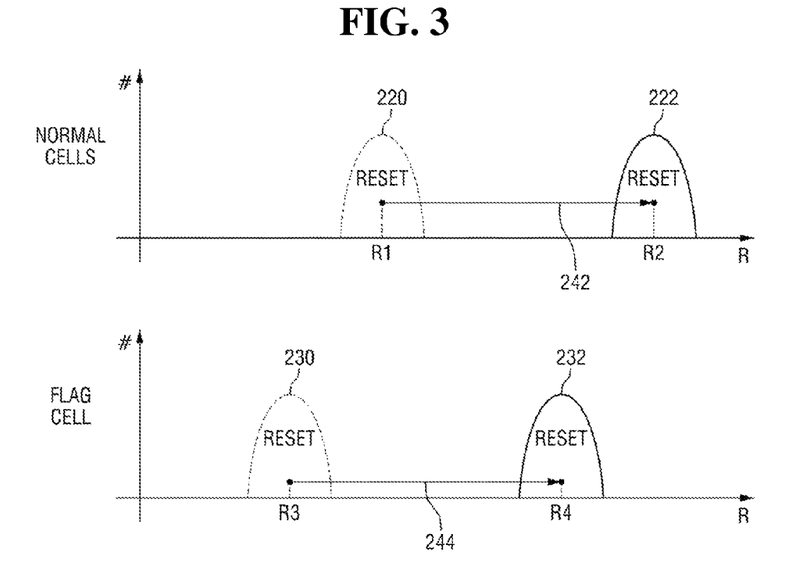
FIG. 3 is a diagram illustrating a stabilization operation of normal cells MC and flag cells FC shown in FIG. 1.
Figure 4:
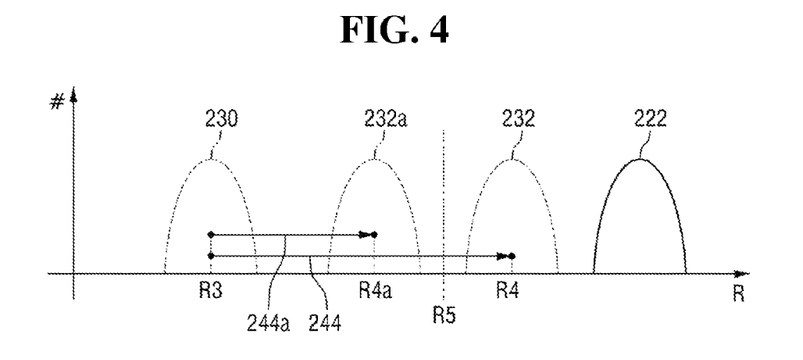
FIG. 4 is a diagram illustrating an operation using the flag cell FC of the memory device 10 shown in FIG. 1.

FIG. 1 is a circuit diagram of a memory device 10 according to example embodiments of the inventive concepts. FIG. 2 is a diagram illustrating a program time tP and a stabilization time tPTA. FIG. 3 is a diagram illustrating a stabilization operation of normal cells MC and flag cells FC shown in FIG. 1. FIG. 4 is a diagram illustrating an operation using the flag cell FC of the memory device 10 shown in FIG. 1.

Referring to FIG. 1, the memory device 10 according to the example embodiments of the inventive concepts may include a first region 110 which includes a plurality of normal cells MC and a second region 120 which includes at least one flag cell FC.

Each of the normal cells MC may include a first resistance material GST1 (e.g., a phase-change material) whose resistance varies according to stored data and a first access device D1 which controls a current flowing through the first resistance material GST1. The first access device D1 may be a diode or transistor coupled in series to the first resistance material GST1. The first access device D1 illustrated in the drawing is a diode. Various types of materials may be used as the phase-change material. For example, the phase-change material may be a combination of two elements such as GaSb, InSb, InSe, Sb2Te3 or GeTe, a combination of three elements such as GeSbTe, GaSeTe, InSbTe, SnSb2Te4 or InSbGe, or a combination of four elements such as AgInSbTe, (GeSn)SbTe, GeSb(SeTe) or Te81Ge15Sb2S2. Among them, GeSbTe that contains germanium (Ge), antimony (Sb), and tellurium (Te) may be typically used for the phase-change material.

The flag cell FC may have the same or similar structure as each of the normal cells MC. A stereoscopic structure of the flag cell FC will be described later with reference to FIGS. 5 and 6. The flag cell FC may include a second resistance material GST2 whose resistance varies according to stored data and a second access device D2 which controls a current flowing through the second resistance material GST2.

The normal cells MC may be electrically connected to a plurality of bit lines BL0 through BLk−1, respectively, and a word line WL. In addition, the flag cell FC may be electrically connected to a bit line BLk1 and the word line WL. Here, a plurality of normal cells MC and at least one flag cell FC may be connected to one word line WL. However, example embodiments of the inventive concepts are not limited to this arrangement.

Referring to FIG. 2, to write data to a normal cell MC, a first write current is supplied to the normal cell MC during the program time tP. Specifically, to program set data to a normal cell MC, a set write current corresponding to the set data is supplied to the normal cell MC. To program reset data to the normal cell MC, a reset data current corresponding to the reset data is supplied to the normal cell MC.

After the program time tP is over, the resistance of the normal cell MC may not remain constant but may drift. For example, the resistance of the normal cell MC may increase during the stabilization time tPTA (time of program-to-active). After the stabilization time tPTA, the resistance of the normal cell MC may no longer drift but may be stabilized. Hence, data stored in the normal cell MC can be read accurately only after the normal cell MC is stabilized.

As shown in the drawing, the stabilization time tPTA may be far longer than the program time tP. For example, the stabilization time tPTA may be more than approximately 20 times longer than the program time tP. For example, if the program time tP is 0.9 µs, the stabilization time tPTA may be 19.1 μs. The stabilization time tPTA has a great influence on improving the performance of the memory device 10 using resistance materials.

In the memory device 10 according to the example embodiments of the inventive concepts, the flag cell FC is used to determine whether the normal cells MC have been stabilized. Specifically, when it is determined that the flag cell FC has been stabilized, it may be understood that the normal cells MC have been stabilized. Whether the flag cell FC has been stabilized may be determined by comparing the resistance of the flag cell FC with a reference resistance. The flag cell FC may be stabilized later than the normal cells MC. In other words, the flag cell FC may be stabilized after all of the normal cells MC are stabilized. Therefore, when the flag cell FC is stabilized, it may be understood that all of the normal cells MC have been stabilized. A specific method of determining whether cells have been stabilized will be described later with reference to FIGS. 3 and 4. When it is determined that the flag cell FC has been stabilized, data may be read from the normal cells MC. On the other hand, when it is determined that the flag cell FC has not been stabilized, data may not read from the normal cells MC.

For example, one flag cell FC may be provided for every n (where n is a natural number) normal cells MC. The n normal cells MC may be programmed simultaneously. Therefore, the n normal cells MC may be electrically connected to the same word line WL as shown in FIG. 1. For example, when one flag cell FC is used for every 64 normal cells MC, it may be understood that an overhead of approximately 1.56% is generated.

Referring to FIGS. 3 and 4, the x axis represents resistance R, and the y axis represents the number (#) of cells.

When a reset write current is supplied to a plurality of normal cells MC, a resistance distribution of the normal cells MC may be a first resistance distribution 220. However, during the stabilization time tPTA, the resistance distribution of the normal cells MC may exhibit a change 242 from the first resistance distribution 220 to a second resistance distribution 222.

When the reset write current is supplied to a plurality of flag cells FC, a resistance distribution of the flag cells FC may be a third resistance distribution 230. However, during the stabilization time tPTA, the resistance distribution of the flag cells FC may exhibit a change 244 from the third resistance distribution 230 to a fourth resistance distribution 232.

The third resistance distribution 230 may be smaller than the first resistance distribution 220. Likewise, the fourth resistance distribution 232 may be smaller than the second resistance distribution 222. That is, if reset data is programmed simultaneously to a flag cell FC and a plurality of normal cells MC corresponding to the flag cell FC, the flag cell FC may be stabilized after all of the normal cells MC corresponding to the flag cell FC are stabilized. In this case, if the flag cell FC is stabilized, it may be understood that the corresponding normal cells MC have been stabilized.

The above process can be summarized using an example as follows.

Referring to FIG. 3, normal cells MC may be programmed to a first resistance R1 and stabilized as their respective resistances drift from the first resistance R1 to a second resistance R2. Here, a flag cell FC corresponding to the normal cells MC may be programmed to a third resistance R3 which is smaller than the first resistance R1 and stabilized as its resistance drifts from the third resistance R3 to a fourth resistance R4 which is smaller than the second resistance R2.

Referring to FIG. 4, when the resistance R4 of the flag cell FC is greater than a reference resistance R5, it may be determined that the flag cell FC has been stabilized. This is because a resistance distribution of the flag cell FC has changed from the third resistance distribution 230 to the fourth resistance distribution 232 due to a sufficient lapse of the stabilization time tPTA.

On the other hand, when the resistance R4a of the flag cell FC is smaller than the reference resistance R5, it may be determined that the flag cell FC has not yet been stabilized. This is because the resistance distribution of the flag cell FC has changed from the third resistance distribution 230 only to a fourth resistance distribution 232a, as is illustrated in FIG. 4, due to an insufficient lapse of the stabilization time tPTA.

An example method of making a resistance distribution 230 illustrated in FIG. 3 corresponding to reset data of a flag cell FC smaller than a resistance distribution 220 illustrated in FIG. 3 corresponding to reset data of a normal cell MC will now be described with reference to FIGS. 5 through 7.

Figure 5:
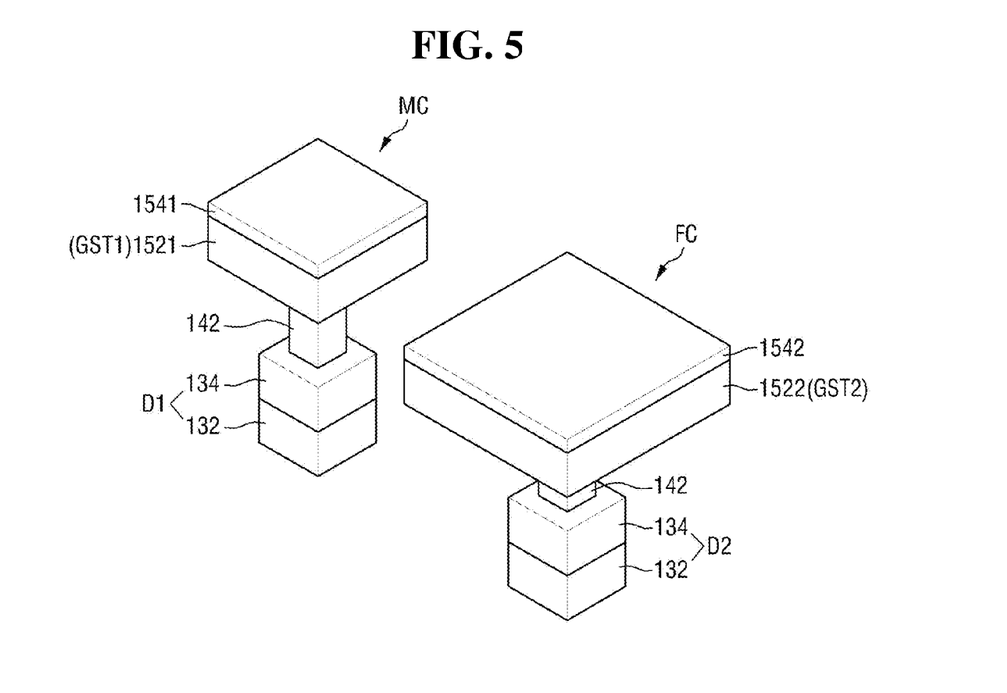
FIG. 5 is a perspective view of an example flag cell used in the memory device.

FIG. 5 is a perspective view of an example flag cell used in the memory device.

Referring to FIG. 5, a normal cell MC included in the memory device may include a first resistance material 1521 (GST1) and a first access device D1.

A top electrode contact 1541 may be disposed on the first resistance material 1521 (GST1). The top electrode contact 1541 may be formed by stacking, e.g., Ti/TiN. The top electrode contact 1541 may be optional.

A bottom electrode contact 142 may be disposed between the first resistance material 1521 (GST1) and the first access device D1. The bottom electrode contact 142 may be, e.g., TiN.

The first access device D1 may include a first semiconductor pattern 132 of a first conductivity type (e.g., an n type) and a second semiconductor pattern 134 of a second conductivity type (e.g., a p type). The second semiconductor pattern 134 may have a higher impurity concentration than the first semiconductor pattern 132. The first access device D1 may be designed to reduce a leakage current that flows through a reverse biased cell diode when a reverse bias is applied. The reverse bias may be applied to the first access device D1 of an unselected phase-change memory cell during a write or read operation.

Although not shown in the drawing, a word line may be formed under the first access device D1, and a bit line may be formed on the top electrode contact 1541.

The flag cell FC may include a second resistance material 1522 (GST2) and a second access device D2. The flag cell FC may have the same or substantially the same configuration of the normal cell MC.

As shown in the drawing, the first resistance material 1521 (GST1) of the normal cell MC may have a first layout area, and the second resistance material 1522 (GST2) of the flag cell FC may have a second layout area which is larger than the first layout area. That is, the first resistance material 1521 (GST1) of the normal cell MC and the second resistance material 1522 (GST2) of the flag cell FC may have the same or substantially the same thickness but have different layout areas.

In this state, a first write current may be supplied to the normal cell MC during the program time tP to program reset data to the normal MC, and a second write current may be supplied to the flag cell FC during the program time tP to program reset data to the flag cell FC. Here, the amount of the first write current may be equal to the amount of the second write current. Since the first resistance material 1521 (GST1) and the second resistance material 1522 (GST2) have different layout areas, they have different resistances even if the first write current and the second write current are the same.

The resistance of the second resistance material 1522 (GST2) may be smaller than the resistance of the first resistance material 1521 (GST1). Therefore, a resistance distribution 220 illustrated in FIG. 3 corresponding to the reset data of the normal cell MC may be greater than a resistance distribution 230 illustrated in FIG. 3 corresponding to the reset data of the flag cell FC.

Figure 6:
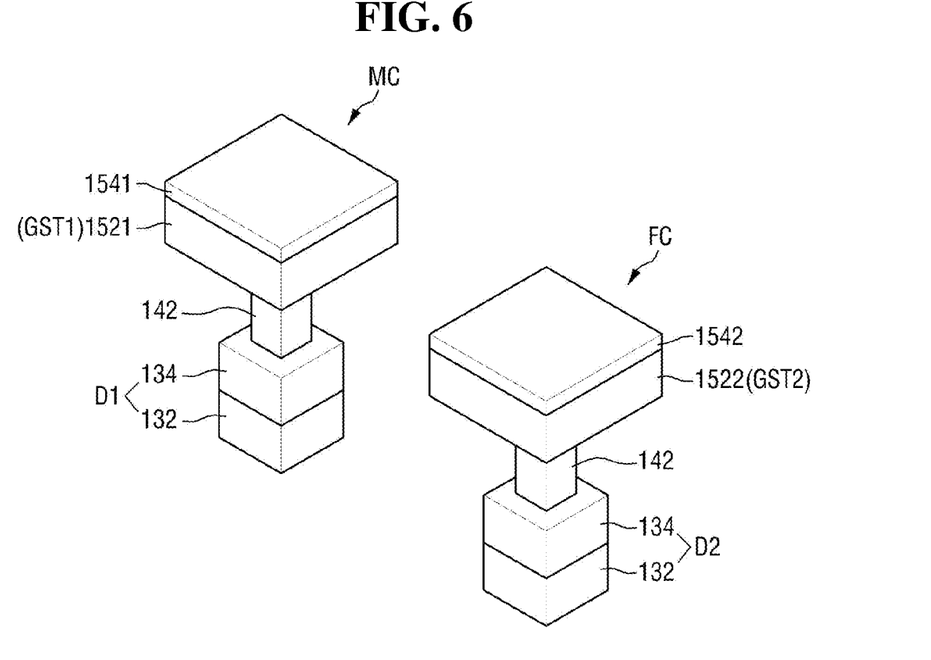
FIG. 6 is a perspective view of another example flag cell used in the memory device.

FIG. 6 is a perspective view of another example flag cell used in the memory device. FIG. 7 is a diagram illustrating write currents used in FIG. 6. For simplicity, the following description will focus on substantial differences from FIG. 5.

Figure 7:
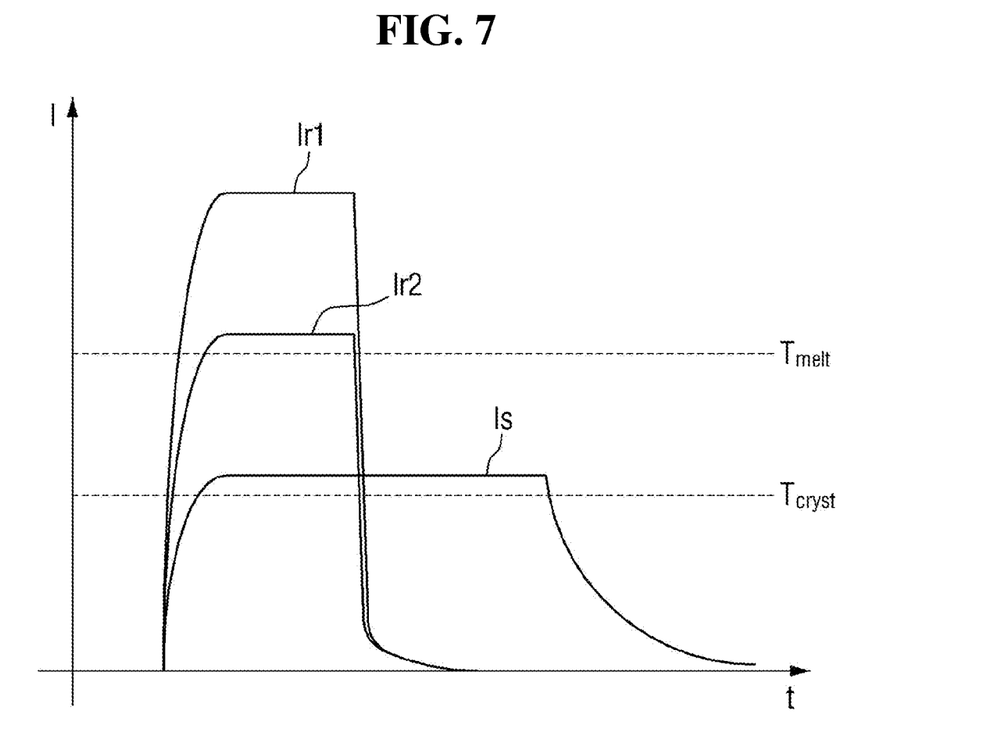
FIG. 7 is a diagram illustrating write currents used in FIG. 6. For simplicity, the following description will focus on substantial differences from FIG. 5.

Referring to FIGS. 6 and 7, a first resistance material 1521 (GST1) of a normal cell MC and a second resistance material 1522 (GST2) of the flag cell FC may have the same layout area.

In this case, a first write current Ir1 illustrated in FIG. 7 may be supplied to the normal cell MC to program reset data to the normal cell MC, and a second write current Ir2 which is smaller than the first write current Ir1 may be supplied to the flag cell FC to program reset data to the flag cell FC. Although the second write current Ir2 is smaller than the first write current Ir1, the second write current may correspond to a temperature greater than a melting temperature Tmelt to put the second resistance material 1522 (GST2) in a reset state (an amorphous state).

When the second write current Ir2 corresponds to a temperature greater than the melting temperature Tmelt, a resistance distribution 220 illustrated in FIG. 3 corresponding to the reset data of the normal cell MC may be greater than a resistance distribution 230 illustrated in FIG. 3 corresponding to the reset data of the flag cell FC.

To write set data to the normal cell MC, a current Is corresponding to a temperature smaller than the melting temperature Tmelt and greater than a crystallization temperature Tcryst is supplied to the normal cell MC.

Figure 8:
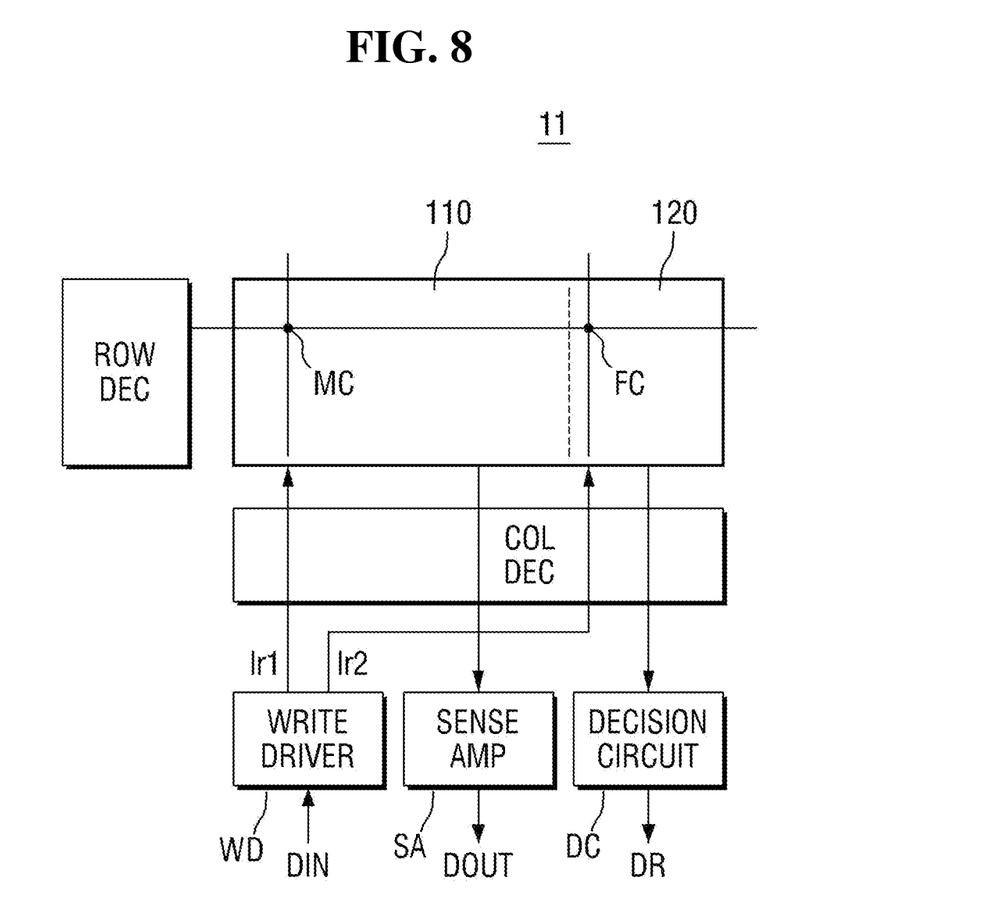
FIG. 8 is a block diagram of a specific implementation example of the memory device 10 shown in FIG. 1.

FIG. 8 is a block diagram of a specific implementation example of the memory device 10 shown in FIG. 1.

Referring to FIG. 8, a memory device 11 according to some example embodiments of the inventive concepts may include a first region 110 which includes a plurality of normal cells MC, a second region 120 which includes at least one flag cell FC, a write driver WD, a sense amplifier SA, and a decision circuit DC.

As described above, respective resistances of the normal cells MC may be changed to program data to the normal cells MC. The resistances of the normal cells MC may be stabilized after drifting. At least one flag cell FC corresponds to a plurality of normal cells MC. To program data to the flag cell FC, the resistance of the flag cell FC may be changed. The resistance of the flag cell FC is stabilized after drifting. The flag cell FC is stabilized later than the normal cells MC.

The write driver WD may write data to the normal cells MC and the flag cell FC. Specifically, the write driver WD may receive input data DIN and supply a first write current Ir1 corresponding to the input data DIN to the normal cells MC. In addition, the write driver WD may supply a second write current Ir2 to the flag cell FC to identify whether the flag cell FC has been stabilized. The second write current Ir2 may be a current used to program reset data.

The decision circuit DC may decide whether the flag cell FC has been stabilized in order to determine whether the normal cells MC have been stabilized. Specifically, the decision circuit DC may read data stored in the flag cell FC by supplying a decision current to the flag cell FC. Then, the decision circuit DC may decide whether the data stored in the flag cell FC, represented by the resistance of the flag cell FC, is greater than a reference resistance and outputs the decision result DR.

The sense amplifier SA may read data from the normal cells MC. Specifically, the sense amplifier SA may read data stored in the normal cells MC by supplying a read current to the normal cells MC, for example, if the decision result DR indicates that the resistance of the flag cell FC is greater than the reference resistance.

Figure 9:
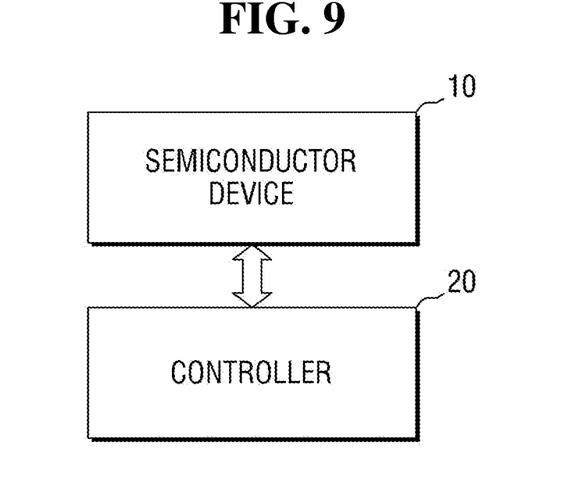
FIG. 9 is an example system using a memory device according to some example embodiments of the inventive concepts.
Figure 10:
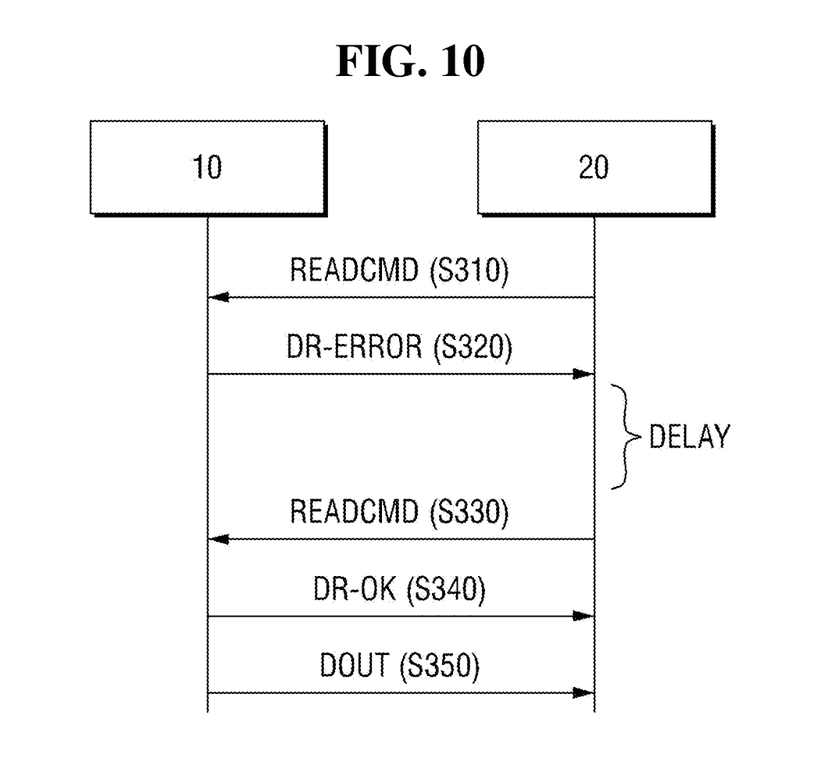
FIG. 10 is a diagram illustrating an operation method of the system shown in FIG. 9.

FIG. 9 is an example system using a memory device according to some example embodiments of the inventive concepts. FIG. 10 is a diagram illustrating an operation method of the system shown in FIG. 9.

Referring to FIG. 9, the system using a memory device according to some example embodiments of the inventive concepts includes a memory device 10 and a controller 20.

As described above, the memory device 10 may include a plurality of normal cells MC and at least one flag cell FC. The normal cells MC may be programmed to a first resistance and stabilized as their respective resistances drift from the first resistance to a second resistance. The flag cell FC may be programmed to a third resistance which is smaller than the first resistance and stabilized as its resistance drifts from the third resistance to a fourth resistance which is smaller than the second resistance.

The controller 20 may perform a data not valid (DNV) function. Specifically, the controller 20 may identify whether the flag cell FC has been stabilized. When the flag cell FC has not been stabilized, the controller 20 may not read the normal cells MC and reattempt to read the normal cells MC after a predetermined or reference period of time. Here, the predetermined or reference period of time may be a period of time during which the flag cell FC can be fully stabilized. As described above, since a stabilization time tPTA can be, e.g., 19.1 μs, the predetermined or reference period of time may be longer than 19.1 μs, for example, may be, but not is limited to, 240 μs.

The non-stabilization of the flag cell FC, which is the non-stabilization of the normal cells MC, may be a very temporary error. That is, after the stabilization time tPTA, the flag cell FC or the normal cells MC may become a normal state. Therefore, when the flag cell FC has an error, it may be desirable to read the flag cell FC again after a predetermined or reference period of time.

Referring to FIG. 10, the DNV function is performed as follows. In operation S310, the controller 20 may provide a read command READCMD as well as an address to the memory device 10. Then, the memory device 10 may read the flag cell FC and determines whether the flag cell FC has been stabilized. In operation S320, the memory device 10 may provide an error state DR-ERROR to the controller 20.

The controller 20 may wait a predetermined or reference period of time DELAY.

Again, in operation S330, the controller 20 may provide the read command READCMD and the address to the memory device 10. Then, the memory device 10 may determine whether the flag cell FC has been stabilized by reading the flag cell FC. In operation S340, the memory device 10 may provide a normal state DR-OK to the controller 20. In operation S350, the memory device 10 may output data DOUT stored in a normal cell MC that matches the address.

The operation described above with reference to FIG. 10 is merely an example and may be fully modified by those of ordinary skill in the art.

Figure 11:
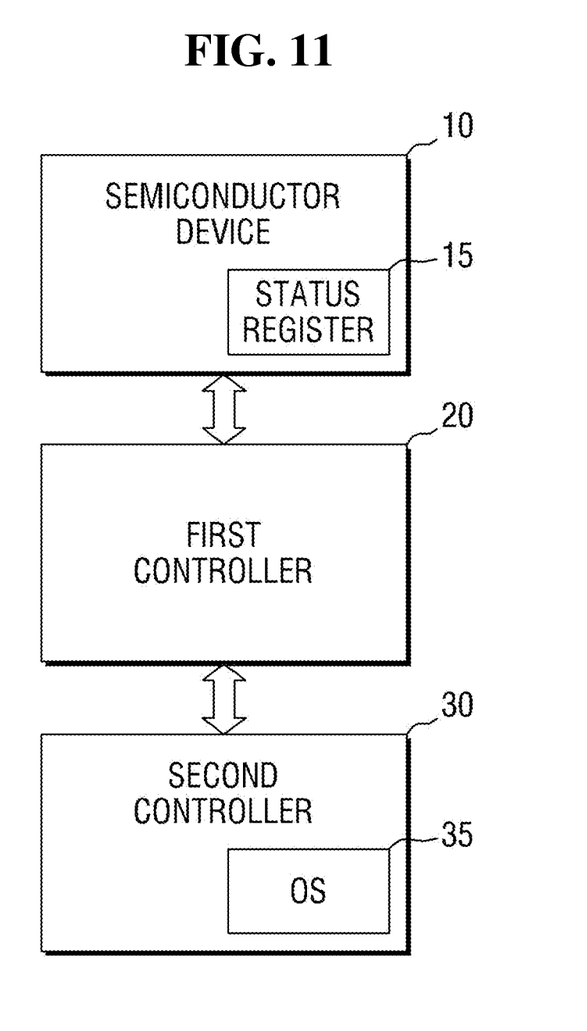
FIG. 11 is a block diagram of another example system using a memory device according to some example embodiments of the inventive concepts.

FIG. 11 is a block diagram of another example system using a memory device according to some example embodiments of the inventive concepts. In FIG. 11, a first controller 20 may not have a DNV function.

The memory device according to some example embodiments of the inventive concepts may include a second controller 30 having an operating system (OS) 35, the first controller 20 communicating with the second controller 30, and a memory device 10 communicating with the first controller 20.

The memory device 10 may include a plurality of normal cells MC which are programmed to a first resistance and stabilized as their respective resistances drift from the first resistance to a second resistance and at least one flag cell FC which is programmed to a third resistance smaller than the first resistance and stabilized as its resistance drifts from the third resistance to a fourth resistance smaller than the second resistance. Furthermore, the memory device 10 may include a status register 15 indicating whether the normal cells MC can be read according to whether the flag cell FC has been stabilized. The status register 15 may indicate whether the flag cell FC has been stabilized. Also, the status register 15 may store the time required until the flag cell FC is stabilized.

The OS 35 may read data stored in the status register 15 and, when the normal cells MC cannot be read, reattempt to read the normal cells MC after a predetermined or reference period of time.

When data only about whether the flag cell FC has been stabilized is stored in the status register 15, the OS 35 reattempts a read operation after a preset or reference period of time.

Alternatively, when the time required until the flag cell FC is stabilized is stored in the status register 15, the OS 35 reattempts the read operation after the stored time.

Each of the systems described above with reference to FIGS. 9 and 11 may be implemented, for example, as a memory card such as a personal computer (PC) card (e.g., Personal Computer Memory Card International Association (PCMCIA)), a compact flash card (CF), a smart media card (SM/SMC), a memory stick, a multimedia card (e.g., MMC, RS-MMC and MMCmicro), a SD card (e.g., SD, miniSD, microSD, and SDHC), or a universal flash storage (UFS).

Alternatively, each of the systems described above with reference to FIGS. 9 and 11 may be implemented as a solid state drive (SSD).

Alternatively, each of the systems described above with reference to FIGS. 9 and 11 may be applicable to computers, ultra-mobile PCs (UMPCs), workstations, net-books, personal digital assistants (PDAs), portable computers, web tablets, wireless phones, mobile phones, smart phones, e-books, portable multimedia players (PMPs), portable game devices, navigation devices, black boxes, digital cameras, three-dimensional televisions, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory device comprising:
   a normal cell which is configured to be programmed to a first resistance and stabilized as a resistance of the normal cell drifts from the first resistance to a second resistance;
   a flag cell which is configured to be programmed to a third resistance smaller than the first resistance and stabilized as a resistance of the flag cell drifts from the third resistance to a fourth resistance smaller than the second resistance; and
   a decision circuit which is configured to decide whether the flag cell has been stabilized in order to determine whether the normal cell has been stabilized.

2. The memory device of claim 1, wherein the normal cell and the flag cell are phase-change memory cells, wherein the normal cell includes a first resistance material having a first layout area, and the flag cell includes a second resistance material having a second layout area which is larger than the first layout area.

3. The memory device of claim 2, wherein the memory device is configured such that a first write current is supplied to the normal cell to program the normal cell, and a second write current is supplied to the flag cell to program the flag cell, wherein an amount of the first write current is equal to an amount of the second write current.

4. The memory device of claim 1, wherein the normal cell and the flag cell are phase-change memory cells and respectively comprise resistance materials having the same layout area.

5. The memory device of claim 4, wherein the memory device is configured such that a first write current is supplied to the normal cell to program the normal cell, and a second write current is supplied to the flag cell to program the flag cell, wherein an amount of the first write current is greater than an amount of the second write current.

6. The memory device of claim 1, wherein the decision circuit is configured to decide whether the resistance of the flag cell is greater than a reference resistance.

7. The memory device of claim 6, further comprising:
   a status register which indicates whether the flag cell has been stabilized.

8. The memory device of claim 6, further comprising:
   a status register which stores a time required until the flag cell is stabilized.

9. The memory device of claim 1, wherein the memory device is configured such that n normal cells can be programmed simultaneously, and one flag cell is provided for every n normal cells, wherein n is a natural number.

10. The memory device of claim 1, wherein the flag cell is configured such that when the flag cell is programmed to the third resistance, reset data is programmed to the flag cell.

11. A memory device comprising:
    a plurality of normal cells configured such that respective resistances of each of the plurality of normal cells are stabilized after drifting;
    at least one flag cell which corresponds to the normal cells and is configured to be stabilized later than the normal cells; and
    a decision circuit configured to decide whether the at least one flag cell has been stabilized in order to determine whether the normal cells have been stabilized,
    wherein the memory device is configured such that data is programmed to the normal cells as the respective resistances of the normal cells change, and data is programmed to the at least one flag cell as the resistance of the at least one flag cell changes.

12. The memory device of claim 11, wherein the normal cells and the at least one flag cell are phase-change memory cells, wherein each of the normal cells includes a first resistance material having a first layout area, and the at least one flag cell includes a second resistance material having a second layout area which is larger than the first layout area.

13. The memory device of claim 11, wherein the normal cells and the at least one flag cell are phase-change memory cells and respectively include resistance materials having the same layout area, wherein the memory device is configured such that a first write current is supplied to the normal cells to program the normal cells, a second write current is supplied to the at least one flag cell to program the at least one flag cell, and an amount of the first write current is greater than an amount of the second write current.

14. The memory device of claim 11, wherein the memory device is configured such that normal cells are programmed simultaneously, and one flag cell corresponds to the normal cells.

15. The memory device of claim 11, wherein the memory device is configured such that if the at least one flag cell is programmed, reset data is programmed to the at least one flag cell.

16. A memory device comprising:
a first memory cell;
a flag memory cell;
a write driver configured to store first data in the first memory cell by setting a resistance of the first memory cell, and configured to store second data in the flag memory cell by setting a resistance of the flag memory cell;
a decision circuit configured to generate a decision signal based on the resistance of the flag memory cell and a reference resistance value, the decision signal indicating whether or not the resistance of the flag cell has stabilized; and
a sense amplifier configured to read the first data from the first memory cell based on the determination signal.

17. The memory device of claim 16, wherein the sense amplifier is configured to read the first data only after the determination signal indicates the resistance of the flag cell has stabilized.

18. The memory device of claim 16, wherein the write driver is configured such that the resistance of the flag memory cell is set to be lower than the set resistance of the first memory cell.

19. The memory device of claim 16, wherein the decision circuit is configured such that the generated decision signal indicates the resistance of the flag cell has stabilized if the resistance of the flag cell is above the reference resistance value, and the generated decision signal indicates the resistance of the flag cell has not stabilized if the resistance of the flag cell is below the reference resistance value.

* * * * *